United States Patent [19]

Mimeault et al.

[11] Patent Number: 5,455,506
[45] Date of Patent: Oct. 3, 1995

[54] METHOD AND PORTABLE TESTING APPARATUS FOR SAFELY TESTING AN AUTOTRANSFORMER FOR POWER DISTRIBUTION LINES

[75] Inventors: Yvan Mimeault; Jacques Kirouac; Yves Tremblay; Roland Caron, all of Baie-Comeau, Canada

[73] Assignee: Copek Electro Ltée, Quebec, Canada

[21] Appl. No.: 278,238

[22] Filed: Jul. 21, 1994

[51] Int. Cl.⁶ .................................................. G01R 31/06
[52] U.S. Cl. ........................ 324/547; 324/546; 324/726; 340/646
[58] Field of Search .................................. 324/527, 545, 324/546, 547, 726, 158.1; 364/482, 483, 579; 361/35; 340/646

[56] References Cited

U.S. PATENT DOCUMENTS

| | | | |
|---|---|---|---|
| 2,527,568 | 10/1950 | Murray | 175/183 |
| 2,657,356 | 10/1953 | Mulavey | 324/55 |
| 2,910,646 | 10/1959 | Schutzner | 324/55 |
| 2,911,591 | 11/1959 | Pritchett | 324/55 |
| 3,231,817 | 1/1966 | Bailey | 324/158 |
| 3,678,429 | 7/1972 | Collin | 336/170 |
| 3,742,346 | 6/1973 | Specht | 324/55 |
| 3,769,576 | 10/1973 | Norkaitis | 324/51 |
| 3,823,369 | 7/1974 | Sinha | 324/51 |
| 4,241,306 | 12/1980 | Bump | 324/55 |
| 4,362,987 | 12/1982 | Clinton | 324/52 |
| 4,654,806 | 3/1987 | Poyser et al. | 364/551 |
| 4,758,774 | 7/1988 | Crawford et al. | 324/55 |
| 4,772,978 | 9/1988 | Oura et al. | 361/36 |
| 4,857,827 | 8/1989 | Zoltan | 324/55 |
| 4,857,856 | 8/1989 | Coleman et al. | 324/547 |
| 5,034,681 | 7/1991 | Reeves | 324/118 |
| 5,172,067 | 12/1992 | Hoffmann | 324/713 |

*Primary Examiner*—Kenneth A. Wieder
*Assistant Examiner*—Diep Do
*Attorney, Agent, or Firm*—Michael D. Bednarek; Marks & Murase

[57] ABSTRACT

A method and an apparatus are provided for safely testing an autotransformer of power distribution lines which has an identified centre tap ground connector, a primary winding terminal and a secondary winding terminal. The method for safely testing the autotransformer includes the steps of disconnecting the terminals and connector of the autotransformer from the distribution lines, applying a first testing AC voltage having a maximum value of substantially one volt only between a first of the terminals and the ground connector, measuring a first value of an AC voltage between the first terminal and the ground connector, and measuring a second value of an AC voltage between the second of the terminals and the ground connector. Thereafter, the method includes the steps of applying a second testing AC voltage having a maximum value of substantially one volt only between the second terminal and the ground connector, measuring a third value of an AC voltage between the second terminal and the ground connector, and measuring a fourth value of an AC voltage between the first terminal and the ground connector. Then, the method further includes steps of comparing the four measured values to predetermined constants, and generating corresponding signals indicating that autotransformer is short-circuited or that the same is open-circuited. When, the autotransformer being test is not short-circuited nor open-circuited, the method includes the step of generating a signal indicating that the first terminal is the secondary winding terminal or the first terminal is the primary winding terminal, whereby the primary and secondary terminals are clearly identified.

19 Claims, 4 Drawing Sheets

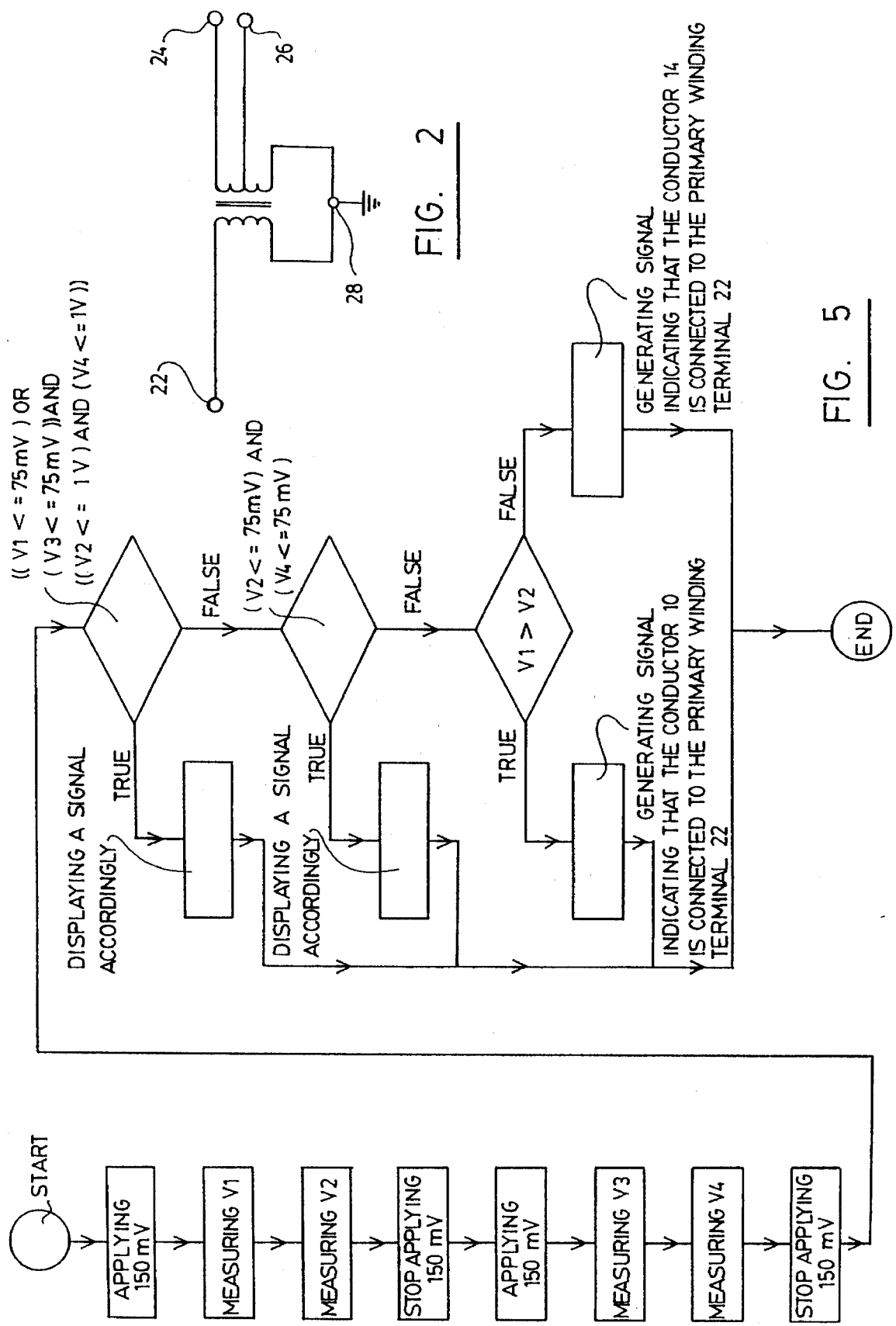

METHOD AND PORTABLE TESTING APPARATUS FOR SAFELY TESTING AN AUTOTRANSFORMER FOR POWER DISTRIBUTION LINES

BACKGROUND OF THE INVENTION a) Field of the Invention

The present method relates to a method and a portable testing apparatus for safely testing an autotransformer for power distribution lines.

b) Background of the Invention

Known in the art, there is the U.S. Pat. No. 2,910,646 of E. J. Schutzner, granted on Oct. 27, 1959, wherein there is described a portable ratio tester for transformers. This portable ratio tester comprises a carrying case, a source of low voltage pulsations, and a four arm bridge circuit having resistances in arms three and four in the same ratio as the anticipated ratio of the transformer windings to be connected. The tester also comprises binding post terminals on its case for connecting the primary winding of the transformer into arm one of the bridge circuit, and for connecting the secondary winding of the transformer into arm two of the bridge circuit, a galvanometer bridged across the bridge circuit from a point between arms one and two to a point between arms three arid four, and means for applying the voltage pulsations upon the terminals in arm two for the transformer secondary winding. In operation, when the transformer windings are properly connected in the bridge circuit, the voltage applied across the bridge circuit will be the sum of the applied voltage plus the voltage induced in the transformer primary winding.

Also known in the art, there is the U.S. Pat. No. 4,654,806 of T. D. Poyser et al., granted on Mar. 31, 1987, wherein there is described a method and an apparatus for monitoring transformers. This method comprises steps of monitoring at least one parameter related to transformer load, collecting periodic load data in response to the monitored parameters, monitoring transformer parameters related to transformer condition, collecting periodic data in response to the monitored parameters related to transformer condition, establishing predetermined load threshold values, establishing predetermined condition threshold values, comparing said periodic data with said predetermined load threshold values, comparing said periodic condition data with said predetermined condition threshold values, and evaluating transformer performance in response to the comparison steps.

Furthermore, there is the U.S. Pat. No. 4,772,978 of Yoshifumi Oura et al., granted on Sep. 20, 1988, wherein there is described a transformer protection system. In this transformer protection system, data of voltages and currents detected at individual terminals of a transformer connected to an electric power system are supplied to a computer. The computer computes driving point admittances or shunt admittances of the transformer on the basis of the voltage and current data and predetermined transfer admittances of the transformer and decides that an internal fault has occurred in the transformer when the values of the driving point admittances or shunt admittances deviate from pre-set reference values, thereby disconnecting the transformer from the electric power system.

The patents described hereinbefore, do not provide a method having necessary steps by which a user can safely test an autotransformer of power distribution lines, and they do not provide a portable testing apparatus having necessary means for safely testing the autotransformer.

Also known in the art, there are the U.S. Pat. Nos. 2,527,568; 2,657,356; 2,911,591; 3,231,817; 3,678,429; 3,742,346; 3,769,576; 3,823,369; 4,241,306; 4,362,987; 4,758,774; 4,857,827; 4,857,856; 5,034,681 and 5,172,067, describing different transformer monitoring systems and methods, and testers for windings in transformers or other electrical components. But none of these patents describe a method having necessary steps by which a user can safely test an autotransformer of power distribution lines and a portable testing apparatus having necessary means for safely testing the same.

OBJECTS OF THE INVENTION

It is an object of the present invention to provide a method having necessary steps by which a user can safely test an autotransformer of power distribution lines.

It is also an object of the present invention to provide a portable testing apparatus having necessary means for safely testing the autotransformer.

SUMMARY OF THE INVENTION

According to the present invention, there is provided a method for safely testing an autotransformer for power distribution lines, said autotransformer having an identified centre tap ground connector, a primary winding terminal and a secondary winding terminal, said method comprising the steps of:

a) disconnecting said terminals and connector of said autotransformer from said distribution lines;

b) applying a first testing AC voltage having a maximum value of substantially one volt only between a first of said terminals and said ground connector, and i) measuring a first value of an AC voltage between said first terminal and said ground connector, and ii) measuring a second value of an AC voltage between the second of said terminals and said ground connector;

c) applying a second testing AC voltage having a maximum value of substantially one volt only between said second terminal and said ground connector, and iii) measuring a third value of an AC voltage between said second terminal and said ground connector, and iv) measuring a fourth value of an AC voltage between said first terminal and said ground connector;

d) comparing said first, third, second and fourth values respectively with first, second, third and fourth predetermined constants, and generating a signal indicating that said autotransformer is short-circuited only if:

said first value is smaller than or equal to a first predetermined constant or said third value is smaller or equal to a second predetermined constant, and said second value is smaller than or equal to a third predetermined constant and said fourth value is smaller than or equal to a fourth predetermined constant;

e) comparing said second and fourth values respectively with fifth and sixth predetermined constants, and generating a signal indicating that said autotransformer is open-circuited only if:

said second value is smaller than or equal to a fifth predetermined constant, and said fourth value is smaller than or equal to a sixth predetermined constant;

f) comparing said first value to said second value, and generating a signal indicating that said first terminal is said secondary winding terminal only if said first value is smaller than said second value, or else said first terminal is said primary winding terminal, whereby said primary and secondary terminals are clearly identified.

Preferably, the method according to the present invention further comprises the steps of:

g), after all of said steps (a) to (f), applying a third testing AC voltage which is higher than said first and second testing signals only between said primary winding terminal and said ground connector, and v) measuring a fifth value of an AC voltage between said primary winding terminal and said ground connector, vi) measuring a sixth value of an AC voltage between said secondary winding terminal an said ground connector;

h) calculating a transformation ratio of said autotransformer where said transformation ratio=(sixth value/fifth value);

i) comparing value of said transformation ratio calculated in said step (h) to a range of predetermined values, and generating a signal indicating that the transformation ratio of said autotransformer is acceptable if said transformation ratio is within said predetermined range of values or else generating a signal indicating that the transformation ratio of said autotransformer is unacceptable.

Preferably, when said autotransformer comprises an additional secondary winding terminal, said method further comprises the steps of repeating steps (b) to (f) wherein said primary winding terminal and said additional secondary winding terminal are used in said repeated steps (b) to (f), whereby, at the end of the repeated step (f), said primary and additional secondary terminals are clearly identified.

Preferably, said first and second testing AC voltages have an amplitude in the order of 150 millivolts and a frequency in the order of 60 hertz, and the third testing AC voltage has an amplitude in the order of 20 volts and a frequency in the order of 60 hertz.

Also preferably, said first and second predetermined constants have a value in the order of 75 millivolts, said third and fourth predetermined constants have a value in the order of 1 volt, and the range of predetermined values corresponds substantially to ±0.5% of an expected transformation ratio.

Preferably, the method comprises the step of displaying signals corresponding to said signals generated in said steps (d), (e) and (f).

According to the present invention, there is also provided a portable testing apparatus for safely testing an autotransformer for power distribution lines, said autotransformer having an identified centre tap ground connector, a primary winding terminal and a secondary winding terminal, said apparatus comprising:

first conductor for connecting said apparatus to said ground connector of said autotransformer;

a programmable connector switcher having first and second input/output ports connectable to said primary and secondary winding terminals, an input port, an output port and a selecting port, in a first operating position of said switcher, said input and output ports being connected to said first input/output port, in a second operating position of said switcher, said input port being connected to said first input/output port and said output port being connected to said second input/output port, in a third operating position of said switcher, said input and output ports being connected to said second input/output port, in a fourth operating position of said switcher, said input port being connected to said second input/output port and said output port being connected to said first input/output port, in operation a signal received at said selecting port being at least for selecting one of said operating positions;

a signal generator means for generating an AC voltage having a maximum value of substantially one volt, having an output connected to said input port of said switcher;

a voltmeter having an input for receiving a signal from said output port of said switcher, in operation said voltmeter measuring respectively first, second, third and fourth values when said switcher is respectively in said first, second, third and fourth operating positions;

logic circuitry means having an output connected to said selecting port of said programmable switcher and an input connected to an output of said voltmeter, said logic circuitry means being for comparing respectively said first, third, second and fourth values measured by said voltmeter to first, second, third and fourth predetermined constants, and generating a first signal indicating that said autotransformer is short-circuited only if:

said first value is smaller than or equal to a said first predetermined constant or said third value is smaller or equal to said second predetermined constant, and said second value is smaller than or equal to said third predetermined constant and said fourth value is smaller than or equal to said fourth predetermined constant, said logic circuitry means being also for comparing respectively said second and fourth values measured by said voltmeter to fifth and sixth predetermined constants, and generating a second signal indicating that said autotransformer is open-circuited only if:

said second value is smaller or equal to said fifth predetermined constant, and said fourth value is smaller than or equal to said sixth predetermined constant, said logic circuitry means being also for comparing said first value to said second value, and generating a selecting signal applied to said selecting port only if said first value is smaller than said second value, said selecting signal indicating that said first input/output port of said switcher is connected to said secondary terminal, or else said first input/output is connected to said primary terminal, whereby said primary and secondary terminals of said autotransformer are clearly identified by said apparatus; and a display unit having an input for receiving said first and second signals of said logic circuitry means and displaying a visual signal accordingly.

Preferably, said signal generator means is a programmable signal generator means for also generating an AC voltage having an amplitude higher than one volt and a frequency in the order of 60 hertz, said programmable signal generator having a control input connected to an output of said logic circuitry means.

Also, preferably, the apparatus comprises a signal converting unit having an input connected to said output port of said switcher, and an output connected to an input of said voltmeter, in operation said converting unit converts signals received from said switcher into corresponding digital signals which are sent to said voltmeter, said signal converting unit including a programmable amplifier having an input connected to said input of said converting unit, an AC to DC converter having an input connected to an output of said amplifier, and an analog to digital converter having an input connected to an output of said AC to DC converter. Furthermore, said voltmeter and said logic circuitry are parts of a microcontroller which is connected to said display unit, and said portable testing apparatus comprises a keyboard by which, in operation, a user sends command signals to said microcontroller.

Preferably, said display unit comprises a LCD display screen and LEDs, said AC to DC converter is a RMS AC to DC converter, and said analog to digital converter is a twelve bit analog to digital converter.

Preferably, the signal generator means is for generating an AC voltage having a frequency in the order of 60 hertz.

The objects, advantages and other features of the present invention will become more apparent upon reading of the following none restrictive description of preferred embodiment thereof, given for the purpose of exemplification only with reference to the accompanying drawings.

BRIEF DESCRIPTION OF THE DRAWINGS

FIG. 2 is a schematic view of the structure of the autotransformer of FIG. 1;

FIG. 5 which is on the drawing of FIG. 2, is an algorithm of a method for safely testing an autotransformer for power distribution lines according to the present invention.

DETAILED DESCRIPTION OF THE DRAWINGS

Figure 1:
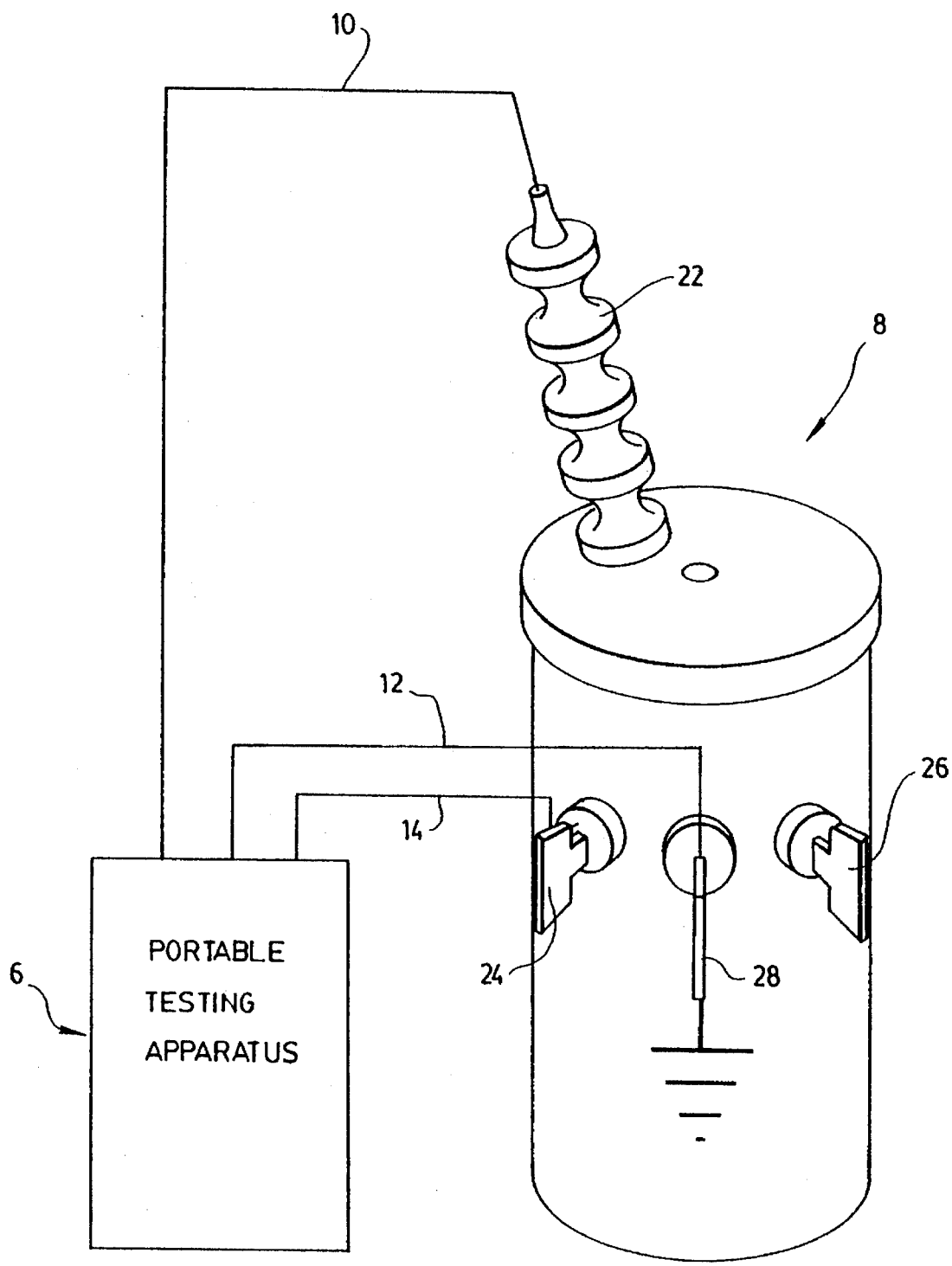
FIG. 1 is a perspective view partially in block diagram, showing how a portable testing apparatus according to the present invention is connected to a two-winding autotransformer of power distribution lines.
Figure 4:
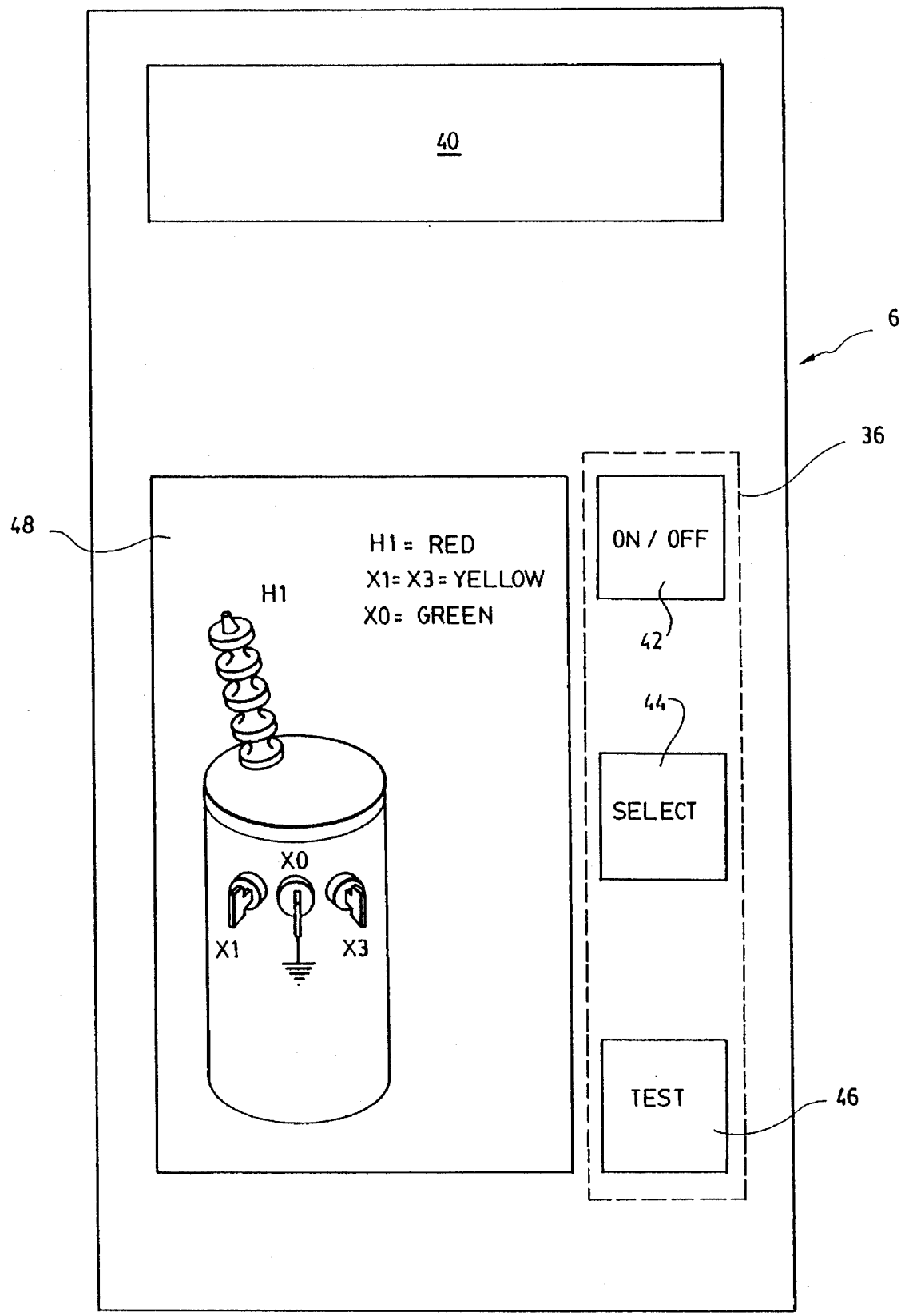
FIG. 4 is a front view of the portable testing apparatus of FIG. 1.

Referring now to FIGS. 1, 2 and 4, the portable testing apparatus 6 for safely testing an autotransformer for power distribution lines 8 is provided with three conductors, respectively numbered 10, 12 and 14, for connection to the terminals of the autotransformer 8. The apparatus 6 is also provided with a LCD display screen 40 allowing the display of the testing instruction steps and the display of the test results, and LEDs (not shown) serving for the same purpose. The LEDS are proven to be particularly useful when the apparatus is used at low temperatures when the LCD screen 40 is less effective. Furthermore, the apparatus 6 has a picture 48 glued thereonto showing the autotransformer 8 that is usually tested and which conductors to use for connection to the corresponding terminals of the autotransformer 8. As shown on the picture 48, the conductors 10, 12 and 14, each being respectively colored with, red, green and yellow, should be connected to a primary winding terminal 22 labelled H1, an identified centre tap ground connector 28 labelled Xo, a first secondary winding terminal 24 labelled X1 and a second secondary winding terminal 26 labelled X3, respectively.

The apparatus further has a keyboard 36 for selecting the type of the transformer and for executing the test. This keyboard 36 includes an ON/OFF switch 42, a select switch 44 which serves for selecting appropriate testing procedures according to the transformer to be tested, and a test switch 46 to perform different tests described hereinafter.

Figure 3:
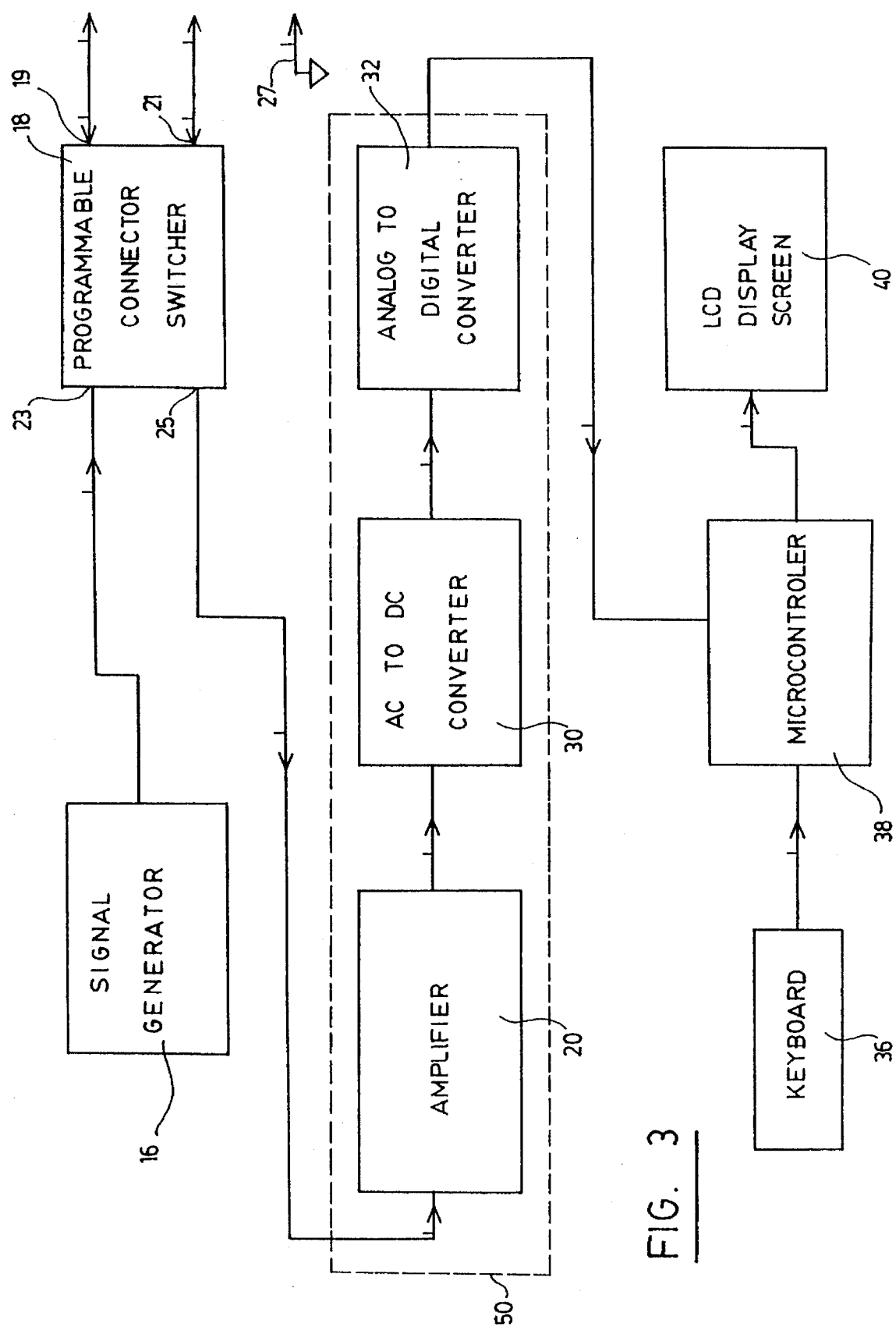
FIG. 3 is a block diagram of the portable testing apparatus of FIG. 1.

Referring to FIGS. 1 and 3, there is shown the block diagram of the apparatus 6 which has a programmable connector switcher 18 having two input/output terminals, 19 and 21, connected respectively to the conductors 10 and 14. The ground terminal 27 of the apparatus 6 is connected to conductor 12. The switcher 18 also has an input 23 connected to a 60 Hz programmable sinusoidal wave generator 16 used for testing the autotransformer 8, an output 25 connected to a high precision programmable amplifier 20 of the signal converting unit 50 used for controlling corresponding amplitudes of signals. The signal converting unit 50 serves for converting signals received from the switcher 18 into the corresponding signals which are sent to a microcontroller 38, and also comprises a RMS AC to DC converter 30 having an input connected to an output of the aforesaid amplifier 20 and an output connected to an analog to digital converter 32, more specifically a twelve bit analog to digital converter. The microcontroller 38, connected to the keyboard 36 and to the display 40, receives digital signals from the signal converting unit 50, stores them and takes appropriate measures based thereon.

When the apparatus 6 is used for testing the autotransformer 8, firstly the last must be disconnected from the power distribution lines (not shown), and thereafter, the ground conductor 12 can be connected to the center tap ground connector 28. Moreover, the two conductors, 10 and 14, can be respectively connected to the primary winding terminal 22 and to one of the secondary winding terminals, 24 or 26, or vice versa. As can be apparent to those skilled in the art any type of connecting devices, such as crocodile clips for instance, can be used for connecting the conductors to the terminals and the ground connector of the autotransformer. After the conductors, 10, 12 and 14, have been connected to the respective terminals and to the ground connector, the apparatus 6 is ready to initiate a preliminary test to verify if the autotransformer 8 is short-circuited, open-circuited, and to clearly identify to which winding terminals, 22 or one of the secondary winding terminals, 24 or 26, the conductors, 10 and 14, have been connected before the apparatus 6 can initiate further tests.

Referring now to FIGS. 1, 3 and 5, there is shown in FIG. 5 an algorithm of the aforesaid preliminary test. As shown, firstly, the microcontroller 38 is programmed to apply a low voltage having an amplitude of 150 mV and a frequency of 60 Hz to the conductor 10. Thereafter, the microcontroller 38 measures AC voltages between the conductor 10 and the conductor 12, and between the conductor 14 and the conductor 12, and memorizes these AC voltages in a variable V1 and in a variable V2 respectively. Following this, the low AC voltage applied to the conductor 10 is removed, and thus the applying of that voltage to the winding terminal of the autotransformer 8 to which the conductor 10 has been connected, is stopped.

After that, the microcontroller 38 applies the low voltage having the amplitude of 150 mV and the frequency of 60 Hz to the conductor 14, and measures AC voltages between the conductor 14 and the conductor 12, and between the conductor 10 and the conductor 12, and memorizes these voltages in a variable V3 and in a variable V4 respectively. Then, the low AC voltage applied to the conductor 14 is removed, and thus the applying of that voltage to the winding terminal of the autotransformer 8 to which the conductor 14 has been connected, is stopped.

The voltages, between the conductors of the apparatus 6 connected to the respective winding terminals of the autotransformer 8, are measured with the help of the aforesaid signal converting unit 50. During the tests, the signals about to be measured flow through the high precision programmable amplifier 20. Thereafter, the amplified signal is adapted to be processed by the AC to DC converter 30 in its most precise range. Indeed, the best AC to DC converters have a precision of approximately 0.1% for levels of 10 mV to 7 V RMS. By amplifying low tensions emanating from the secondary winding of the autotransformer 8 with the high precision programmable amplifier 20, the voltages are brought to a level for which the AC to DC converter 30 has a precision of approximately 0.01%. A band filter (not shown) having a center frequency of 60 Hz is further added to eliminate any parasite while allowing the signal to flow freely. Furthermore, at the output of the AC to DC converter 30, a continuous signal is converted into a twelve bit digital signal. Because the signal is amplified, this allows for a higher precision conversion.

Once again, when the apparatus 6 is used, after the testing voltages have been applied to the windings of the autotransformer 8, the microcontroller 38 determines if V1 is smaller or equal to 75 millivolts or V3 is smaller or equal to 75 millivolts and at the same time if V2 is smaller or equal to 1 volt and V4 is smaller or equal to 1 volt. If the results of all of the above comparisons have been positive, the microcontroller 38 indicates that the autotransformer 8 is short-circuited and the apparatus 6 displays a visual message on the aforesaid LCD screen 40 accordingly. If it is not the case, the microcontroller 38 determines whether V2 is smaller or equal to 75 millivolts and whether V4 is smaller or equal to 75 millivolts. If it is the case, the microcontroller 38 indicates that the autotransformer 8 is open-circuited and the apparatus 6 displays a visual message on the aforesaid LCD screen 40 accordingly. Finally, if the autotransformer 8 is neither short-circuited or open-circuited, the microcontroller 38 determines whether V1 is greater than V2. If the last is true, meaning V1 is greater than V2, the microcontroller 38 indicates that the conductor 10 is effectively connected to the primary winding terminal 22 of the autotransformer 8, and the conductor 14 is connected to one of the secondary winding terminals, 24 or 26, by generating corresponding signals. Of course, depending to which terminals of the autotransformer 8 the conductors, 10 and 14, were connected, the microcontroller 38 programs the switcher 18 accordingly and the apparatus 6 is ready to measure the transformation ratio of the autotransformer 8.

Because of the above mentioned steps performed with low voltages, it is now possible to safely perform additional steps with higher voltages such as the measurement of the transformation ratio of the autotransformer.

In order to measure the transformation ratio, the microcontroller 38 safely sends an AC signal having an amplitude of 20 volts and a frequency of 60 Hz to the conductor which is connected to the primary winding terminal 22. Thereafter, the microcontroller 38 measures the voltage between the conductor connected to the primary winding terminal 26 and the conductor 12 connected to the ground connector 28, and the voltage between the conductor connected to the one of the secondary winding terminals, 24 or 26, and the conductor 12. The microcontroller 38 stores these voltages in a variable V5 and V6 respectively, calculates the transformation ratio, V6/V5, and determines if the transformation ratio is within a range of ±0.5% of an expected predetermined transformation ratio of the autotransformer 8. If the transformation ratio is within an acceptable range, the apparatus 6 will display a visual message on the LCD screen 40 indicating that the ratio of autotransformer 8 is good. If this is not the case, the apparatus can display various messages. For example, the apparatus 6 can display messages indicating that ratio of the autotransformer is equal to 95% of the nominal value, or to 97.5%, or to 102.5%, or 105%. Of course, if the transformation ratio has a value outside of the range of values listed above, the apparatus 6 simply displays a message indicating that the ratio of the autotransformer 8 is unacceptable. However, if the apparatus 6 is provided with a second selector switch (not shown) for selecting testing procedures for transformers at 95%, 97.5%, 100%, 102.5% and 105%, of their nominal transformation ratios, the apparatus 6 could display a message indicating that the transformation ratio of the autotransformer is good but that only for the selected nominal transformation ratio. In order to test the autotransformer at 100% of its nominal transformation ratio, the second selector switch has to be positioned accordingly.

After the transformation ratio has been calculated and the status of the transformer displayed, the user can proceed with the tests between the primary winding terminal 22 and the other secondary winding terminal, 24 or 26. Once again, the preliminary test is executed and the transformation ratio calculated in a same manner as for the one of the secondary winding terminals. Also, the same visual messages indicating the results of the tests are displayed on the LCD screen 40.

In connection to this, during operations, the apparatus 6 could display other messages. For example, after all of the conductors, 10,12 and 14, have been connected to the winding terminals of the autotransformer, the apparatus 6 could display a message indicating that one or more of these conductors has or have not been properly connected to the terminals of the autotransformer and the test has to be restarted. Also, the microcontroller 38 can be connected to a battery (not shown) for supplying operating power to the apparatus 6, and indicate that the battery has to be replaced. If that is the case, the apparatus could display a visual message on the LCD screen 40 indicating the need for a new battery. Furthermore, the apparatus 6 could have an internal thermometer serving for measuring the temperature inside a housing of the apparatus or surrounding the same. If that temperature is unacceptable, meaning it exceeds a predetermined range, the apparatus 6 could display a visual message indicating that it unable to execute any tests.

The apparatus 6 could be also provided with a sound generator (not shown). This sound generator could indicate that one of the switches has been pressed by producing a beep sound for a short time. Moreover, by varying the period of the beep, the sound generator could indicate that the autotransformer, which has been tested, has a good or unacceptable transformation ratio. For example the sound generator could produce a beep sound for 0.5 seconds if the transformation ratio is good, or for 1.5 seconds if the same is unacceptable.

As can be apparent there are various advantages to the portable testing apparatus according to the present invention. Besides being very safe to use because of the aforesaid preliminary test executed at low AC voltage, the apparatus measures with a high precision ratios of autotransformers and eliminates any parasite caused by its internal circuit and other parasites caused by surrounding elements, such as power distribution lines . . . etc.

The microcontroller 38 is provided with a proper programming to perform the steps of the method according to the present invention. A program has been written to perform this task for use with the controller 38 previously described. The following of the actual program statement:

```
/*******************************************************************/
/*                    RATMOSF.C                                  */
/*                    MODELE CK-01                               */
/*          version pour micro-controleur 68HC11                 */
```

```
/*          les messages en francais sont dans francais.h        */
/*                      Donald Gagnon                             */
/*                      Marc Levesque                             */
/*                      fevrier 1994                              */
/****************************************************************/
#include <stdio.h>
#include <io.h>
include <francais.h>   /*contient les messages a afficher*/ define TOUJOURS  1
define SOND1     0
#define SOND2     1
#define OSCILL    2
#define TENSION   3
#define G1        0
#define G2        1
#define G4        2
#define G8        3
#define G16       4
#define G32       5
#define G64       6
#define G128      7
#define GND      0x00
#define MOYEN    0x01
#define FORT     0x02
#define OFF      0xff
#define ON       0x00
#define LIMIT    128         /* limite des xfo */
#define TEMPS    1800        /* TEMPS/2= nb seconde pour tomber en STOP MODE */

/******************* declaration des fonctions *********************/
void init();
void stopmode();
void onouoff();
void test();
long unsigned echan();
```

```c
void buzzer();
void buzprise();
void pga100();
void pr2406();
void warmup();
void detect();
void delai();
unsigned sample();
void select();
void affich();
void progaff();
void resetaff();
void gnd();
void checkbatt();
```

/************** declaration des variables globales ***************/

```c
@eeprom long unsigned noserie=1;        /*numero de serie*/
@dir pri,sec;
@dir char flag,sonde,datah,onoff;
@dir unsigned mess,arret,datal;
char ratio[17];
volatile char TFLG2 @0x1025;
unsigned charge=0,diff;
int pourcharge,poursous;
```

/************************* programme principale ************************/

```c
void main(void)
{ char xx;

while(TOUJOURS)
    {
      init();
      warmup();                 /* delais de rechauffement du ratiometre*/
      _asm("cli\n");            /*enable irq */
```

```
    xx=PIOC;
    xx=PORTCL;                     /*reset STAF*/ while((arret<TEMPS)&(onoff==ON))
    {   xx=((PIOC) & (0x80));      /*verifi si STRA a ete activer*/
        if (xx==0x80)
          { select();
            xx=PIOC;
            xx=PORTCL;             /*reset STAF*/
          }
        xx=((TFLG2) & (0x80));     /*lis le timer overflow flag */
        if (xx==0x80)
          { TFLG2=0X80;            /* reset le timer overflow flag */
            arret++;               /* incremente le temps */
          }
    }
    stopmode();                    /* tombe en STOP MODE */
  }
}

/********************** definition des fonctions *********************/

/*******************************************************************/
/*                       STOP MODE                                 */
/*******************************************************************/
void stopmode(void)
{
  resetaff();          /* efface l'afficheur */
  arret=0;
  onoff=OFF;
  PORTC=(PORTC)&(0xf7);     /*coupe l'alimentation du reste du circuit*/
  PORTC=0xf7;
  PIOC=(PIOC)&(0xfe);  /* INVB=0  STRB=1 */
  PORTB=0Xff;               /*output a 0 */
  PORTD=0x3f;
```

```
_asm("psha\nldaa #10h\ntap\n");        /*disable irq*/
_asm("stop\nnop\n");                    /* tombe en STOP MODE */
}
```

```
/*******************************************************************/
/***           sous-routine d'initialisation                     */
/*******************************************************************/
void init(void)
{
    mess=arret=datal=0x00;              /*initialise les variables*/
    flag=sonde=datah=0x00;
    onoff=ON;
    PIOC=(PIOC)|(0x01);     /* INV=1   STRB=0*/
    delai(800);             /*stabilisation du ucontroleur evite osc du relais*/
    PORTC=(PORTC)|(0x08);               /* alimente le reste du circuit */
    delai(500);                         /*stabiliser l'alimentation*/
    PORTC=(PORTC)|(0x80);   /*arrete le buzzer */
    pga100(G1,SOND1);
    PORTC=(PORTC)|(0x10);               /* r/c=1*/
}
/*******************************************************************/
/*   sous-routine XIRQ pour metre le ratiometre a ON ou a OFF      */
/*******************************************************************/
@port void onouoff(void)
{
    _asm("nop\n");
    buzzer(20);
    delai(500);
    _asm("nop\nldaa _onoff\ncoma\nstaa _onoff\n");
    if(onoff==OFF)          /*met l'adresse de stopmode au pc dans la pile*/
        _asm("tsx\nldd #_stopmode\nstd 7,x\ntxs\n");
    else
        _asm("tsx\nldd #0d02dh\nstd 7,x\ntxs\n");
}
```

```
/*****************************************************************/
/* sous-routine de test des xfo. le choix du bon test est determiner */
/* par la valeur de mess.                                            */
/*****************************************************************/
@port void test(void)
{
  double resprim,ressec,facgain,ratiof,min,max,pc,nominal,constante;
  int b;
  unsigned v;

affich(&xfo1[mess],1);        /* Re-ecrit la sorte de transfo. */ buzzer(20);
  if (flag==0x00)               /*test si une selection a ete faite*/
  { affich(&faitdab,1);
    affich(&votsel,2);
    arret=0;
    return;
  }
  affich(&check,2);             /* ecrit TEST EN COURS */ detect();         /*demele prim et sec et identifie short et open*/ if (sonde==0xff)   /* verifie si xfo est short ou circuit ouvert */
     goto testbatt;

/*programme le pga100 et le 2406 pour */
  pr2406(FORT,pri);           /*determiner le gain*/
  pga100(G1,sec);
  delai(500);
  v=sample();                 /* sert a determiner le gain */ pga100(G1,pri);
  delai(500);
  resprim=echan();            /*lis le primaire pour calcul du ratio */
```

```
                        /* 5*16*256 convertions */ if(sonde==0xff)         /*verifie si les samples sont ok */
    return;
                        /* determine le gain du pga100 en se servant */
                        /* de la lecture du secondaire (v) quand on */
                        /* envoie oscill fort au primaire */
if (v<=383)             /*  58.5mv*16=383 (7.5v/128)*/
    {pga100(G128,sec);
     facgain=128.0;
    }
else
    if (v<=768)         /*117mv*16=768 */
        {pga100(G64,sec);
         facgain=64.0;
        }
    else
        if  (v<=1456)
            {pga100(G32,sec);
             facgain=32.0;
            }
        else
            if  (v<=2912)
                {pga100(G16,sec);
                 facgain=16.0;
                }
            else
                if (v<=5808)
                    {pga100(G8,sec);
                     facgain=8.0;
                    }
                else
                    if (v<=11632)
                        {pga100(G4,sec);
                         facgain=4.0;
                        }
```

```
         else
            if (v<=23264)
              {pga100(G2,sec);
               facgain=2.0;
              }
         else
            {pga100(G1,sec);
             facgain=1.0;
            }
                                    /* determine les parametres de comparaison*/
         if (mess==64)              /* test si c'est xfo1 19.9k-120 */
            {
               min=165.17;          /*comparaison pour 19.9k-120*/
               max=166.83;
               nominal=1.66;        /*166/100*/
            } if (mess==80)              /* test si c'est xfo2 19.9k-347 */
            { min=57.2165;          /*comparaisons pour 19.9k-347*/
              max=57.791;
              nominal=0.57504;      /*57.504/100*/
            } if (mess==0)               /*test si c'est xfo3 14.4k-120*/
            { min=119.4;            /*comparaisons pour 14.4k-120*/
              max=120.6;
              nominal=1.2;          /*120/100*/
            } if (mess==16)              /*test si c'est xfo4 14.4k-347*/
            { min=41.361;
              max=41.777;           /*comparaisons pour 14.4k-347*/
              nominal=0.41569;      /*41.569/100*/
            }
```

```
if (mess==32)              /*test si c'est xfo5 7.2k-120*/
   {  min=59.7;             /*comparaisons pour 7.2k-120*/
      max=60.3;
      nominal=.6;      /*60/100*/
   } if (mess==48)              /*test si c'est xfo6 7.2k-347*/
   {  min=20.681;
      max=20.8885;           /*comparaisons pour 7.2k-347*/
      nominal=.20785;   /*20.785/100*/
   } if (mess==96)              /*test si c'est xfo7 2.4k-120*/
   {  min=19.9;             /*comparaisons pour 2.4k-120*/
      max=20.1;
      nominal=.2;       /*20/100*/
   } if (mess==112)             /*test si c'est xfo8 2.4k-600*/
   {  min=3.98;
      max=4.02;              /*comparaisons pour 2.4k-600*/
      nominal=.04;      /*4/100*/
   }
if (mess==128)             /*comparaisons pour rapport de 1*/
   {  min=0.995;
      max=1.005;
      nominal=.01;
   } delai(500);                /* delais de programmation du pga100 */ ressec=echan();            /* lis le secondaire pour calcul du ratio*/
```

```c
                          /* 5*16*256 convertions */ if(sonde==0xff)           /* verifie si les samples sont ok */
      return;

ratiof=(resprim/(ressec/facgain));   /* calcul du ratio */
if(ratiof>500.0)                /*test court-circuit quand ratio trop grand*/
   {affich(&testnook,2);         /* affiche court-circuit */
    buzzer(1500);
    gnd();
    arret=0;
    return;
   }
if (ratiof<10.0)                /* definie le format d'affichage */
   b=3;                         /* 3 decimal */
   else
     if(ratiof<100.0)
       b=2;                     /* 2 decimal */
       else
          if(ratiof<=500.0)
             b=1;               /* 1 decimal */ if ((min<=ratiof)&&(ratiof<=max))     /* verifie si xfo est bon */
   {if (mess==128)              /* verifie si c'est le test de valid*/
       affich(&testok,2);
       else
          (sprintf(ratio,"   R=%*.*lf   ",-6,b+3,ratiof);
           affich(&ratio,1);
           affich(&ratok,2);
          }
    buzzer(500);
   }
else
   {if (mess==128)              /* verifie si c'est test de valid */
       affich(&testnook,2);
       else
```

```
        {sprintf(ratio,"    R=%*.*lf    ",-6,b+3,ratiof);
          affich(&ratio,1);
          affich(&transdef,2);
        }
     pc=ratiof/nominal;          /* calcul le % d'ecart */
     buzzer(1500);
     if ((pc>94.5)&(pc<95.5))    /*test des prises*/
        {delai(2000);
          affich(&prise1,2);
          buzprise();
        }
     if ((pc>97.0)&(pc<98.0))
        {delai(2000);
          affich(&prise2,2);
          buzprise();
        }
     if ((pc>102.0)&(pc<103.0))
        {delai(2000);
          affich(&prise3,2);
          buzprise();
        }
     if ((pc>104.5)&(pc<105.5))
        {delai(2000);
          affich(&prise4,2);
          buzprise();
        }
   } testbatt:
  poursous=0;
  checkbatt();
  gnd();
  arret=0;
}

/*****************************************************************/
```

```
/*  sous-routine qui prend des echantillons et verifie si elles sont    */
/*  correct. renvoi le resultat                                          */
/*********************************************************************/
long unsigned echan(void)
{ long unsigned moyconv;
  int temp,b;
  unsigned prec,resconv;

sonde=0;
  moyconv=0;
  prec=resconv=sample();
  for(b=0;b<4;b++)        /* prend 5 samples et les compare un apres l'autre */
     {moyconv+=resconv;
      resconv=sample();
      temp=resconv-prec;
      if((temp>16)|(temp<-16))  /* difference acceptable entre les deux samples*/
        {sonde=0xff;
         affich(&mauv,2);      /* affiche VERIFIER PINCES */
         gnd();
         arret=0;
         buzzer(1500);
         return(0);
        }
      prec=resconv;
      delai(10);
     }
  return(moyconv+resconv);
}
```

```
/*********************************************************************/
/*  sous-routine qui fait crier le buzzer. lui passer le temps en msec  */
/*********************************************************************/
void buzzer (int ss)
```

```c
{
  PORTC=(PORTC)&(0x7F);    /*buzzer*/
  delai(ss);
  PORTC=(PORTC)|(0x80);
}
```

/****************************************************************/
/* sous-routine de buzzer quand il faut verifier les prises     */
/****************************************************************/

```c
void buzprise(void)
{ buzzer(500);
  delai(100);
  buzzer(500);
  delai(100);
  buzzer(500);
  delai(100);
  buzzer(1500);
}
```

/****************************************************************/
/* sous-routine qui configure le pga100 lui passer le gain desirer(0-7) */
/* ainsi que la sortie a amplifier(sond1=0 sond2=1)             */
/****************************************************************/

```c
void pga100(int g,int in)
{
PORTD=(in<<4)+g;
PORTD=(PORTD)|(0X08);      /*cp=1*/
PORTD=(PORTD)&(0xf7);      /*cp=0*/
}
```

/****************************************************************/
/* sous-routine qui configure le 2406 ainsi que la sortie desire */
/* lui passer l'oscillateur et la sortie.                       */

```c
/* oscill (0-2) & out(0,1)                                          */
/*******************************************************************/
void pr2406(int oscill,int out)
{
 PORTC=0xb8+(out<<2)+oscill;
}

/*******************************************************************/
/*              sous-routine de warmup                              */
/*******************************************************************/
void warmup(void)
{ unsigned x;

resetaff();                 /* reset l'afficheur */
    gnd();                      /* met le gnd a la sortie */
    affich(&annon1,1);          /* affiche l'annonce pour 2 sec */
    affich(&annon2,2);
    delai(2000);
    resetaff();                 /* reset l'afficheur*/
    affich(&ready1,1);          /* affiche BRANCHER CABLES */ sample();                   /* conversion bidon*/
    pga100(G1,TENSION);

for(x=30;x>0;x--)           /* compte a rebour de 30sec */
      {sprintf(ratio,"   ATTENDRE %u   ",x);
        affich(&ratio,2);
        if(x==20)
          {charge=sample()+338;  /* effectue une lecture de la pile a 20sec +35mv */
           delai(500);
          }
        else
          delai(1000);
      }
    affich("                ",2);
```

```
   diff=charge-(sample()+338);  /* effectue une lecture de la pile a 0sec +35mv*/
                                /* calcul de la difference entre les 2 tensions*/
   if(diff>=70)
      poursous=14;
   else
      {if(diff>=35)
         poursous=7;
       else
         poursous=0;
      } checkbatt();
   affich(&ratio,1);        /* affiche % des piles */ pga100(G1,OSCILL);
   delai(2000);
   if(sample()<=39328)      /* test l'oscillateur si >6v (39328=6v*16) */
      {resetaff();          /* reset l'afficheur */
       affich(&sys,1);      /* ecrit SYSTEME NON OPERATIONEL */
       affich(&opera,2);
       buzzer(1500);
       delai(2500);
       onoff=OFF;           /* ferme l'appareil */
       return;
      } affich(&ready2,2);              /*    affiche SELECTION XFO */
   buzzer(500);

}
/********************************************************************/
/***  Fonction pour determiner le % d'etat des piles             ***/
/********************************************************************/ void checkbatt(void)
{
```

```c
pga100(G1,TENSION);
delai(500);
charge=sample()+338;

if(charge>=33424)        /* tension > 5.1v */
   pourcharge=100;       /* % de charge=100% */
else
   pourcharge=(100-((33424-charge)/29.50))-poursous;  /* calcul du % de charge*/ if(pourcharge<=0)        /* tension < 4.65v */
   {resetaff();
   affich(&recharge,1);/*affiche recharger piles*/
   buzprise();
   delai(60000);
   stopmode();           /*Ferme l'appareil*/
   } sprintf(ratio,"    PILES=%3d%%   ",pourcharge);  /* ecrit le % de charge de la pile*/ if(pourcharge<95)                 /* arrondit a 10% pres */
   {if(ratio[11]>=0x35)
      {ratio[11]=0x30;
      ratio[10]=ratio[10]++;
      }
    else
      ratio[11]=0x30;
   }
else
   {ratio[9]=0x31;
   ratio[10]=ratio[11]=0x30;
   } if((ratio[10]<=0x33)&(ratio[9]!=0x31))
   {delai(2500);
   affich(&batlow,2);   /* si % des piles est <=30%, affiche PILE FAIBLE */
```

```
    buzzer(1500);
    delai(2500);
   }

}

/*******************************************************************/
/* sous-routine qui lit v1,v2,v3,v4 et met dans sonde 0ffh s'il y a un  */
/* probleme, 01h (pri=0, sec=1) si sond1 est le primaire et 02h (pri=1, sec=0)*/
/* si sond2 est le primaire                                         */
/*******************************************************************/
void detect(void)
{ unsigned v1,v2,v3,v4;

/***lecture de v1 ***/
  pr2406(MOYEN,SOND1);
  pga100(G1,SOND1);
  delai(500);
  v1=sample();

/***lecture de v2 ***/
  pga100(G1,SOND2);
  delai(500);
  v2=sample();

/***lecture de v3 ***/
  pr2406(MOYEN,SOND2);
  pga100(G1,SOND2);
  delai(500);
  v3=sample();

/***lecture de v4 ***/
  pga100(G1,SOND1);
  delai(500);
```

```
v4=sample();

gnd();

if (((v1<=160)|(v3<=160)) & ((v2<=6555)&(v4<=6555)))
  {sonde=0xff;                    /*court-circuit 25mv*16=160  1v*16=6555 */
   if(mess==128)                  /*verifie si c'est test de valid */
     affich(&short1,2);
   else
     affich(&transdef,2);         /* ecrit tranfo. defect. */
   buzzer(1500);
   return;
  } else
    if ((v2<=160) & (v4<=160))    /* 25mv*16 */
      {sonde=0xff;                /*circuit ouvert */
       if(mess==128)              /* verifie si c'est test de valid*/
         affich(&open,2);
       else
         affich(&transdef,2);     /* ecrit tranfo. defect. */
       buzzer(1500);
       return;
      }
  if(v1>v2)      /* SOND1=primaire   SOND2=secondaire */
   {sonde=0x01;
    pri=0;
    sec=1;
    return;
   }
   sonde=0x02;   /* SOND1=secondaire  SOND2=primaire */
   pri=1;
   sec=0;
}
/******************************************************************/
/*                    sous-routine de delai                       */
```

```c
/*      temps ou le reg D, represente le nombre de ms si xtal=8mhz      */
/*******************************************************************/
void delai(int temps)
{
  _asm("pshx\npshy\n");
  _asm("xgdx\n");
  _asm("d1: ldy #282\n");
  _asm("d2: dey\n");
  _asm("jbne d2\n");
  _asm("nop\n");
  _asm("dex\n");
  _asm("jbne d1\n");
  _asm("puly\npulx\n");
}

/*******************************************************************/
/*      sous-routine d'echantillonnage. le resultat 24 bits         */
/*      est arrondi dans  resconv (16 msb).                         */
/*      on suppose clk=8Mhz, la boucle interne dure 65us            */
/*      65us *256conv= 1 cycles de 60hz (16.64ms)                   */
/*      le resultat est mis dans D  et represente la conv * 16      */
/*******************************************************************/
unsigned sample(void)
{
  _asm("pshx\npshy\n");
  _asm("ldd #00h\n");
  _asm ("staa _datah\n");         /* reset le buffer du resultat */
  _asm ("std _datal\n");
  _asm ("ldy #16\n");
  _asm("sss:ldx #256\n");          /* 16*256=4096 conversions */
  _asm("cont:pshx\n");             /*(4)*/
  _asm("ldx #1000h\n");         /*(3)*/
  _asm ("bclr 10h,03h,x\n");    /* (7)  r/c=0 */
  _asm ("bset 10h,03h,x\n");       /* (7)  r/c=1 */
  _asm ("ldaa #14\n");       /* (2)   delais de 37us 74 cycles */
  _asm ("ici: deca\n");      /* (2)  */
```

```c
_asm ("jbne ici\n");        /* (3)   */
_asm("nop\n");          /*(2) */
_asm("ldab 0ah,x\n"); /*(4)        0ah est portE*/
_asm("ldaa 00,x\n");  /*(4)        00 est portA*/
_asm("anda #0fh\n"); /*(2)*/

_asm("addd _data1\n");          /*(6) vt=vt+v*/
_asm("std _data1\n");           /*(5)*/
_asm("bcc carry\n");            /*(3)*/
_asm("inc _datah\n");           /*(6)*/
_asm("clc\n");                  /* (2) clear carry bit */
_asm("carry:pulx\n");                /*(5)*/
_asm("dex\n");          /*(3)*/
_asm("jbne cont\n");            /*(3)*/
_asm("ldd #4\njsr _delai\n");   /*delais de 4ms*/
_asm("dey\njbne sss\n");

_asm("ldab _data1\n");          /*hbyte de data1*/
_asm("brclr ssuite,80h,_data1+1\n");
_asm("incb\n");
_asm("ssuite: ldaa _datah\n");
_asm("puly\npulx\n");
}

/**********************************************************************/
/**            sous-routine de selection des xfo              **/
/**********************************************************************/
void select(void)
{
    resetaff();             /*reset l'afficheur*/
    buzzer(20);

if (flag==0xff)
        {   if (mess==LIMIT)    /*test si c'est la fin */
              { mess=0x00 ;      /* des types de xfo  */
                affich(&xfo1,1);
```

```
                    }
            else
               {mess+=16;
                 affich(&xfol[mess],1);
               }

}
    else
       { affich(&xfol,1);
          flag=0xff;                    /*premiere fois qu'il */
                                        /*passe dans la s-rtine*/
       }
    arret=0x00;                         /*remise a zero du temps*/
}
```

```
/****************************************************************/
/*   sous-routine d'affichage pour 16 carracteres definis ds un tableau  */
/*   lui passer l'adresse du premier element du tableau a afficher       */
/*   et la ligne de l'afficheur (1 ou 2)                                 */
/****************************************************************/
void affich (char *carac,int ligne)
{int x=0;

progaff();           /*programme l'afficheur*/
if (ligne==2)
   {_asm("pshx\nldx #1000h\nbclr 20h,03h,x\npulx\n");        /*rs=0*/
    PORTB=0xc0;                                              /*deuxieme ligne*/
    delai(7);
    _asm("pshx\nldx #1000h\nbset 20h,03h,x\npulx\n");        /*rs=1*/
   }
else
   {_asm("pshx\nldx #1000h\nbclr 20h,03h,x\npulx\n");        /*rs=0*/
    PORTB=0x02;                                              /*premiere ligne*/
    delai(7);
```

```c
  _asm("pshx\nldx #1000h\nbset 20h,03h,x\npulx\n");        /*rs=1*/
  } while(x<16)                /*affiche les 16 caracteres*/
  {PORTB=*carac;
  carac++;
  x++;
  delai(7);
  }

}
/******************************************************************/
/*         sous-routine de programmation de l'afficheur         */
/******************************************************************/
void progaff(void)
{
  _asm("pshx\nldx #1000h\nbclr 20h,03h,x\npulx\n");        /*rs=0*/
  delai(7);
  PORTB=0x38;    /*8 bit display, 2 lines display, 5x7 dot*/
  delai(7);
  PORTB=0x0c;    /*cursor off, display on, cursor don't blink*/
  delai(7);
  PORTB=0x06;    /*incremente adresse, sans display shift */
  delai(7);
  _asm("pshx\nldx #1000h\nbset 20h,03h,x\npulx\n");        /*rs=1*/
}

/******************************************************************/
/*              sous-routine pour reseter l'afficheur           */
/******************************************************************/
void resetaff(void)
{_asm("pshx\nldx #1000h\nbclr 20h,03h,x\npulx\n");         /*rs=0*/
  PORTB=0x01;                                              /*premiere ligne*/
  delai(7);
  _asm("pshx\nldx #1000h\nbset 20h,03h,x\npulx\n");        /*rs=1*/
```

}

/*******************************************************************/
/*       sous-routine pour mettre le gnd a l'oscillateur           */
/*******************************************************************/
void gnd(void)
{
pr2406(GND,SOND1);
pga100(G1,SOND1);
}

Although the present invention has been explained hereinabove by way of a preferred embodiment thereof, it should be pointed out that any modifications to this preferred embodiment within the scope of the appended claims is not deemed to alter or change the nature and scope of the present invention.

What is claimed is:

1. Method for safely testing an autotransformer for power distribution lines, said autotransformer having an identified centre tap ground connector, a primary winding terminal and a secondary winding terminal, said method comprising the steps of:

a) disconnecting said terminals and connector of said autotransformer from said distribution lines;

b) applying a first testing AC voltage having a maximum value of substantially one volt only between a first of said terminals and said ground connector, and
      i) measuring a first value of an AC voltage between said first terminal and said ground connector, and
      ii) measuring a second value of an AC voltage between the second of said terminals and said ground connector;

c) applying a second testing AC voltage having a maximum value of substantially one volt only between said second terminal and said ground connector, and
      iii) measuring a third value of an AC voltage between said second terminal and said ground connector, and
      iv) measuring a fourth value of an AC voltage between said first terminal and said ground connector;

d) comparing said first, third, second and fourth values respectively with first, second, third and fourth predetermined constants, and generating a signal indicating that said autotransformer is short-circuited only if:
      said first value is smaller than or equal to a first predetermined constant or said third value is smaller or equal to a second predetermined constant, and
      said second value is smaller than or equal to a third predetermined constant and said fourth value is smaller than or equal to a fourth predetermined constant;

e) comparing said second and fourth values respectively with fifth and sixth predetermined constants, and generating a signal indicating that said autotransformer is open-circuited only if:
      said second value is smaller than or equal to a fifth predetermined constant, and
      said fourth value is smaller than or equal to a sixth predetermined constant;

f) comparing said first value to said second value, and generating a signal indicating that said first terminal is said secondary winding terminal only if said first value is smaller than said second value, or else said first terminal is said primary winding terminal, whereby said primary and secondary terminals are clearly identified.

2. A method according to claim 1, further comprising the steps of:

g), after all of said steps (a) to (f), applying a third testing AC voltage which is higher than said first and second testing signals only between said primary winding terminal and said ground connector, and
      v) measuring a fifth value of an AC voltage between said primary winding terminal and said ground connector,
      vi) measuring a sixth value of an AC voltage between said secondary winding terminal an said ground connector;

h) calculating a transformation ratio of said autotransformer where said transformation ratio=(sixth value/fifth value);

i) comparing value of said transformation ratio calculated in said step (h) to a range of predetermined values, and generating a signal indicating that the transformation ratio of said autotransformer is acceptable if said transformation ratio is within said predetermined range of values or else generating a signal indicating that the transformation ratio of said autotransformer is unacceptable.

3. A method according to claim 1, wherein said autotransformer comprises an additional secondary winding terminal, said method further comprising the steps repeating steps (b) to (f) wherein said primary winding terminal and said additional secondary winding terminal are used in said repeated steps (b) to (f), whereby, at the end of the repeated step (f), said primary and additional secondary terminals are clearly identified.

4. A method according to claim 1, wherein said first and second testing AC voltages have an amplitude in the order of 150 millivolts and a frequency in the order of 60 hertz.

5. A method according to claim 2, wherein said third testing AC voltage has an amplitude in the order of 20 volts and a frequency in the order of 60 hertz.

6. A method according to claim 1, wherein said first and second predetermined constants have a value in the order of 75 millivolts, and said third and fourth predetermined constants have a value in the order of 1 volt.

7. A method according to claim 2, wherein said range of predetermined values corresponds substantially to ±0.5% of an expected transformation ratio.

8. A method according to claim 1, comprising the step of displaying signals corresponding to said signals generated in said steps (d), (e) and (f).

9. A method according to claim 2, wherein said autotransformer comprises an additional secondary winding terminal, said method further comprising the steps repeating steps (b) to (f) wherein said primary winding terminal and said additional secondary winding terminal are used in said repeated steps (b) to (f), whereby, at the end of the repeated step (f), said primary and additional secondary terminal are clearly identified.

10. A method according to claim 3, wherein said first and second testing AC voltages have an amplitude in the order of 150 millivolts and a frequency in the order of 60 hertz.

11. A method according to claim 3, wherein said first and second predetermined constants have a value in the order of 75 millivolts, and said third and fourth predetermined constants have a value in the order of 1 volt.

12. A method according to claim 5, wherein said range of predetermined values correspond substantially to ±0.5% of an expected transformation ratio.

13. A method according to claim 3, comprising the steps of displaying signals corresponding to said signals generated in said repeated steps (d), (e) and (f).

14. A portable testing apparatus for safely testing an autotransformer for power distribution lines, said autotransformer having an identified centre tap ground connector, a primary winding terminal and a secondary winding terminal, said apparatus comprising:

first conductor for connecting said apparatus to said ground connector of said autotransformer;

a programmable connector switcher having first and second input/output ports connectable to said primary and secondary winding terminals, an input port, an output port and a selecting port, in a first operating position of said switcher, said input and output ports being connected to said first input/output port, in a second operating position of said switcher, said input port being connected to said first input/output port and said output port being connected to said second input/output port, in a third operating position of said switcher, said input and output ports being connected to said second input/output port, in a fourth operating position of said switcher, said input port being connected to said second input/output port and said output port being connected to said first input/output port, in operation a signal received at said selecting port being at least for selecting one of said operating positions;

a signal generator means for generating an AC voltage having a maximum value of substantially one volt, having an output connected to said input port of said switcher;

a voltmeter having an input for receiving a signal from said output port of said switcher, in operation said voltmeter measuring respectively first, second, third and fourth values when said switcher is respectively in said first, second, third and fourth operating positions;

logic circuitry means having an output connected to said selecting port of said programmable switcher and an input connected to an output of said voltmeter, said logic circuitry means being for comparing respectively said first, third, second and fourth values measured by said voltmeter to first, second, third and fourth predetermined constants, and generating a first signal indicating that said autotransformer is short-circuited only if:

said first value is smaller than or equal to a said first predetermined constant or said third value is smaller or equal to said second predetermined constant, and said second value is smaller than or equal to said third predetermined constant and said fourth value is smaller than or equal to said fourth predetermined constant, said logic circuitry means being also for comparing respectively said second and fourth values measured by said voltmeter to fifth and sixth predetermined constants, and generating a second signal indicating that said autotransformer is open-circuited only if:

said second value is smaller or equal to said fifth predetermined constant, and said fourth value is smaller than or equal to said sixth predetermined constant, said logic circuitry means being also for comparing said first value to said second value, and generating a selecting signal applied to said selecting port only if said first value is smaller than said second value, said selecting signal indicating that said first input/output port of said switcher is connected to said secondary terminal, or else said first input/output is connected to said primary terminal, whereby said primary and secondary terminals of said autotransformer are clearly identified by said apparatus; and a display unit having an input for receiving said first and second signals of said logic circuitry means and displaying a visual signal accordingly.

15. A portable testing apparatus according to claim 14, wherein said signal generator means is a programmable signal generator means for also generating an AC voltage having an amplitude higher than one volt, said programmable signal generator having a control input connected to an output of said logic circuitry means.

16. A portable testing apparatus according to claim 14, further comprising a signal converting unit having an input connected to said output port of said switcher, and an output connected to an input of said voltmeter, in operation said converting unit converts signals received from said switcher into corresponding digital signals which are sent to said voltmeter, said signal converting unit including a programmable amplifier having an input connected to said input of said converting unit, an AC to DC converter having an input connected to an output of said amplifier, and an analog to digital converter having an input connected to an output of said AC to DC converter; and wherein said voltmeter and said logic circuitry are parts of a microcontroller which is connected to said display unit, said portable testing apparatus comprising a keyboard by which, in operation, a user sends command signals to said microcontroller.

17. A portable testing apparatus according to claim 14, wherein said display unit comprises a LCD display screen and LEDs.

18. A portable testing apparatus according to claim 16, wherein said AC to DC converter is a RMS AC to DC converter, said analog to digital converter is a twelve bits analog to digital converter, and said display unit comprises a LCD display screen and LEDs.

19. A portable testing apparatus according to claim 14, wherein said signal generator means is for generating an AC voltage having a frequency in the order of 60 hertz.

* * * * *